United States Patent
Ikegami

(10) Patent No.: US 6,791,241 B1
(45) Date of Patent: Sep. 14, 2004

(54) PIEZOELECTRIC VIBRATOR AND MANUFACTURE THEREOF, AND PIEZOELECTRIC VIBRATOR UNIT

(75) Inventor: Yasumitsu Ikegami, Ina (JP)

(73) Assignee: Seiko Epson Corporation, Tokyo (JP)

( * ) Notice: Subject to any disclaimer, the term of this patent is extended or adjusted under 35 U.S.C. 154(b) by 308 days.

(21) Appl. No.: 09/142,464

(22) PCT Filed: Dec. 16, 1997

(86) PCT No.: PCT/JP97/04623

§ 371 (c)(1),
(2), (4) Date: Sep. 9, 1998

(87) PCT Pub. No.: WO98/31095

PCT Pub. Date: Jul. 16, 1998

(30) Foreign Application Priority Data

Jan. 13, 1997 (JP) .............................................. 9-004162

(51) Int. Cl.[7] .............................................. H01L 41/08
(52) U.S. Cl. ...................................... 310/353; 310/348
(58) Field of Search ................................ 310/351, 353, 310/344, 348

(56) References Cited

U.S. PATENT DOCUMENTS

| | | | | |
|---|---|---|---|---|
| 2,413,579 A | * | 12/1946 | Pennybacker | 310/353 X |
| 3,849,681 A | * | 11/1974 | Scott, Jr. et al. | 310/353 X |
| 4,415,826 A | * | 11/1983 | Kreutzev et al. | 310/353 X |
| 4,486,681 A | * | 12/1984 | Ishigami et al. | 310/353 |
| 4,639,632 A | * | 1/1987 | Nakata et al. | 310/353 |
| 5,867,074 A | * | 2/1999 | Ogiso et al. | 310/353 X |

FOREIGN PATENT DOCUMENTS

| | | | | |
|---|---|---|---|---|
| DE | 2612643 | * | 3/1976 | ................. 316/353 |
| JP | 55-91217 | | 12/1953 | |
| JP | A-57-32118 | | 2/1982 | |
| JP | U-60-132024 | | 9/1985 | |
| JP | A-61-247775 | | 11/1986 | |
| JP | U-63-131224 | | 8/1988 | |
| JP | A-2-207613 | | 8/1990 | |
| JP | A-3-113909 | | 5/1991 | |
| JP | U-3-107821 | | 11/1991 | |
| JP | 06-303077 | | 10/1994 | |
| JP | A-6-303077 | | 10/1994 | |
| WO | 409524075 | * | 9/1995 | |

* cited by examiner

Primary Examiner—Mark Budd
(74) Attorney, Agent, or Firm—Oliff & Berridge, PLC

(57) ABSTRACT

A piezoelectric resonator is assembled so that a gap is formed between a resonator element and a plug using a connecting layer formed with a conductive resin, with flattened leads having leading end portions opening in a U-shape. This piezoelectric resonator permits absorption of an impact by elasticity of the leading end portions. Further, operability can be increased by forming a temporary fixing layer using a UV-setting type resin between the leading end portions and the resonator element, or coating a silver paste on one of the leading end portions and the resonator element prior to forming a connecting layer. It is thus possible to mass-produce a piezoelectric resonator unit high in impact resistance and reliability with only slight variations of frequency when exposed to high temperatures.

12 Claims, 8 Drawing Sheets

[FIG. 1]
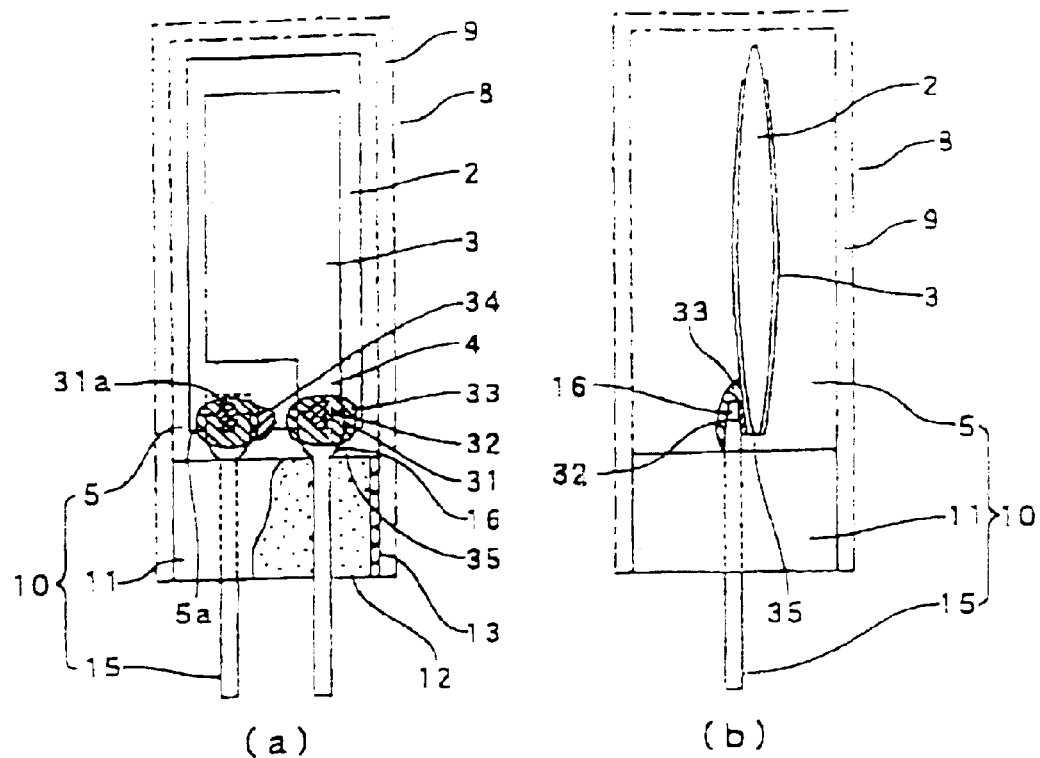
(a) (b)
[FIG. 2]
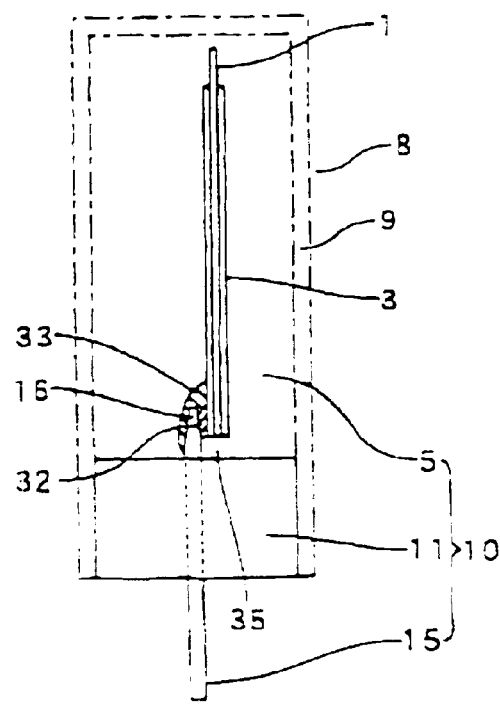

[FIG. 3]
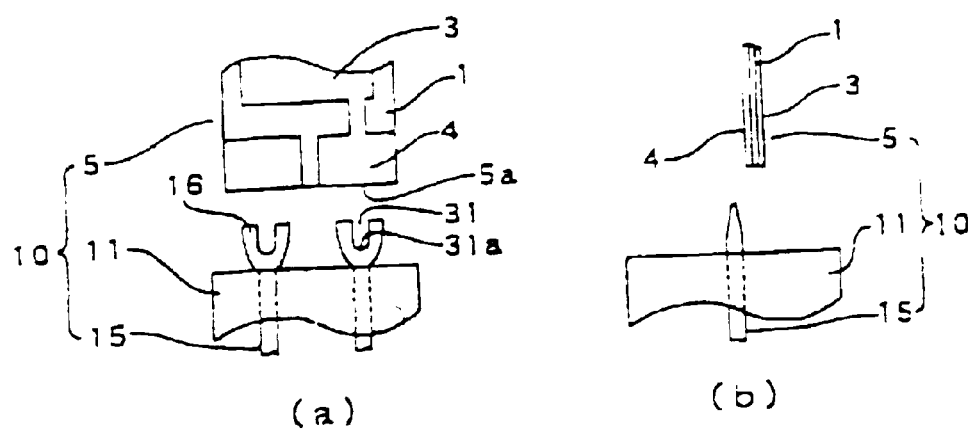
(a)   (b)
[FIG. 4]
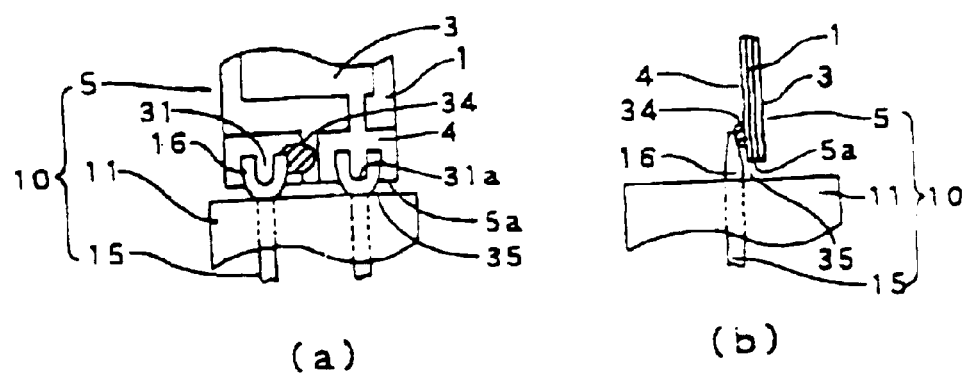
(a)   (b)

[FIG. 5]
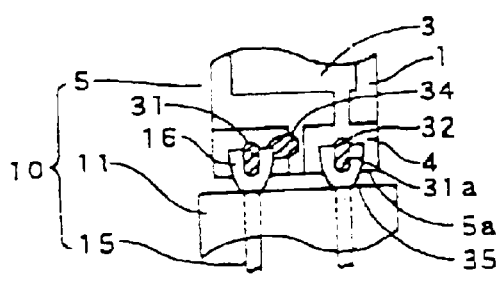
(a)
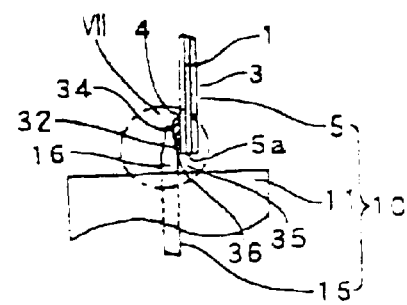
(b)
[FIG. 6]
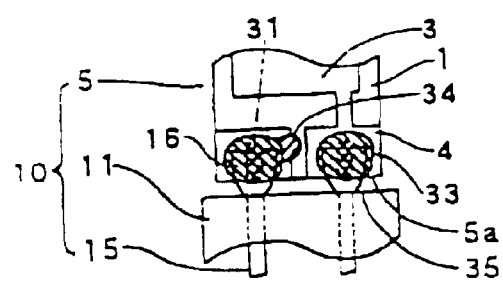
(a)
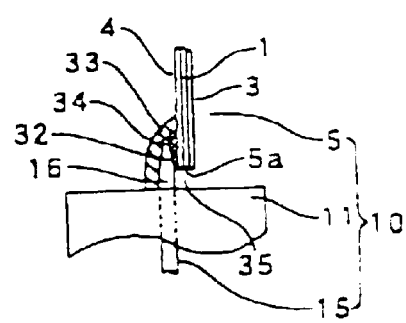
(b)

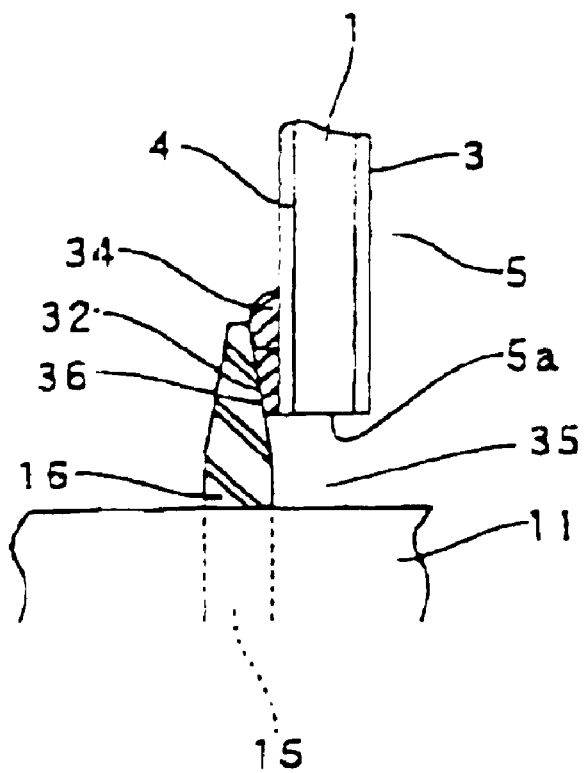
[FIG. 7]

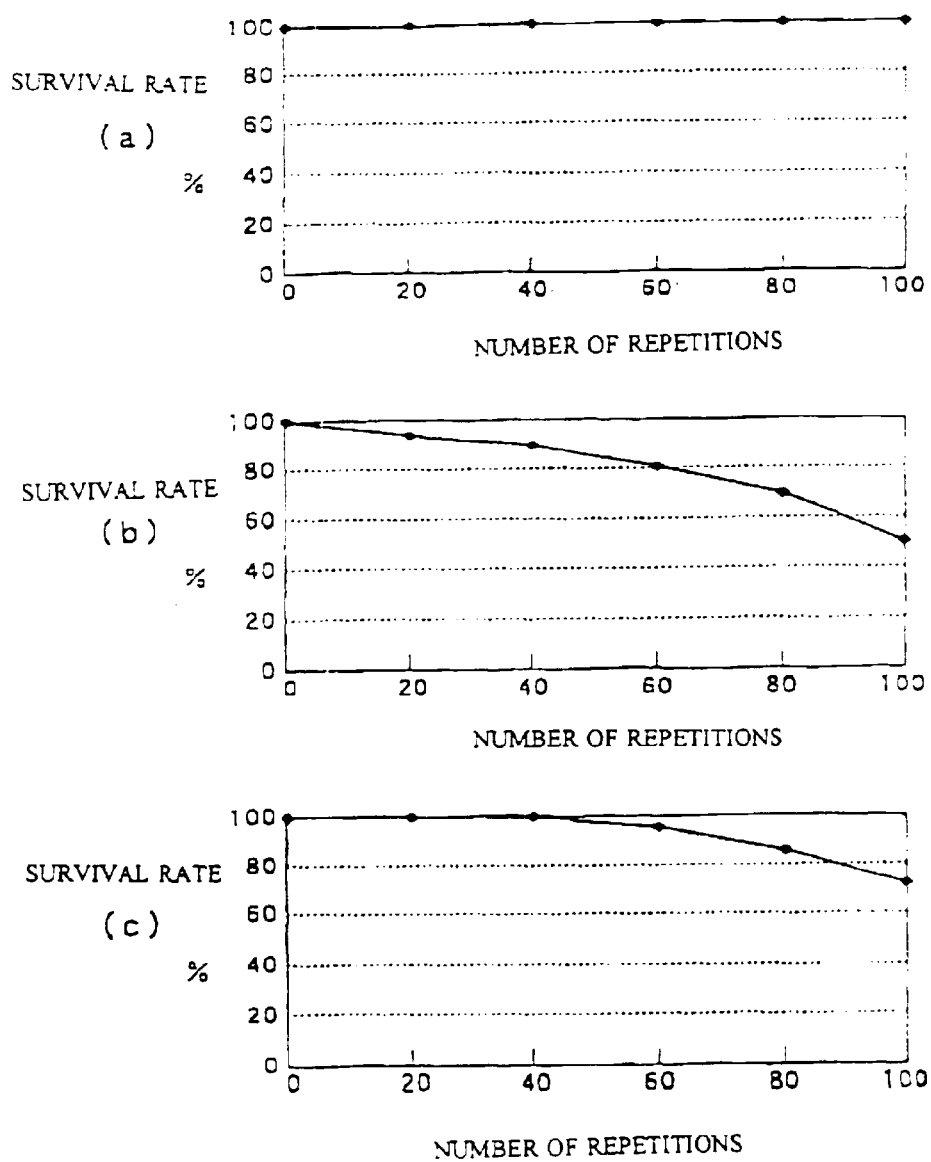

[FIG. 9]
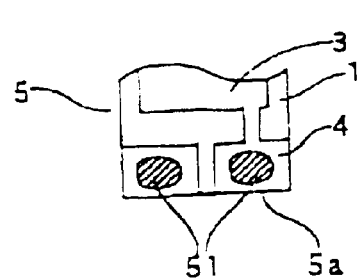
(a)
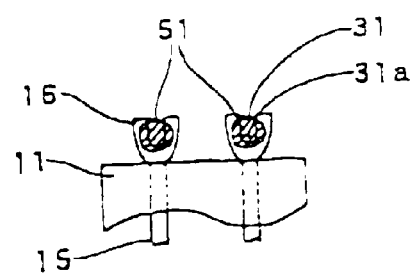
(b)
[FIG. 10]
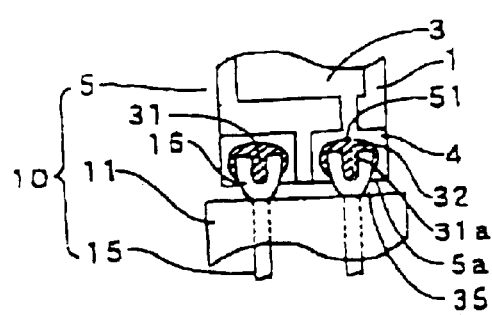
(a)
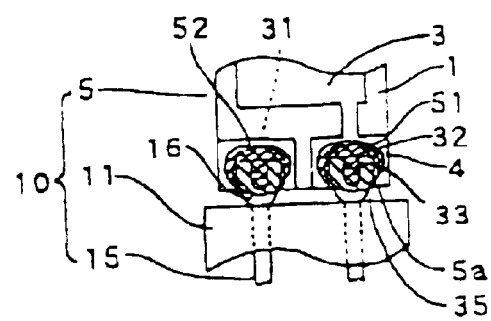
(b)

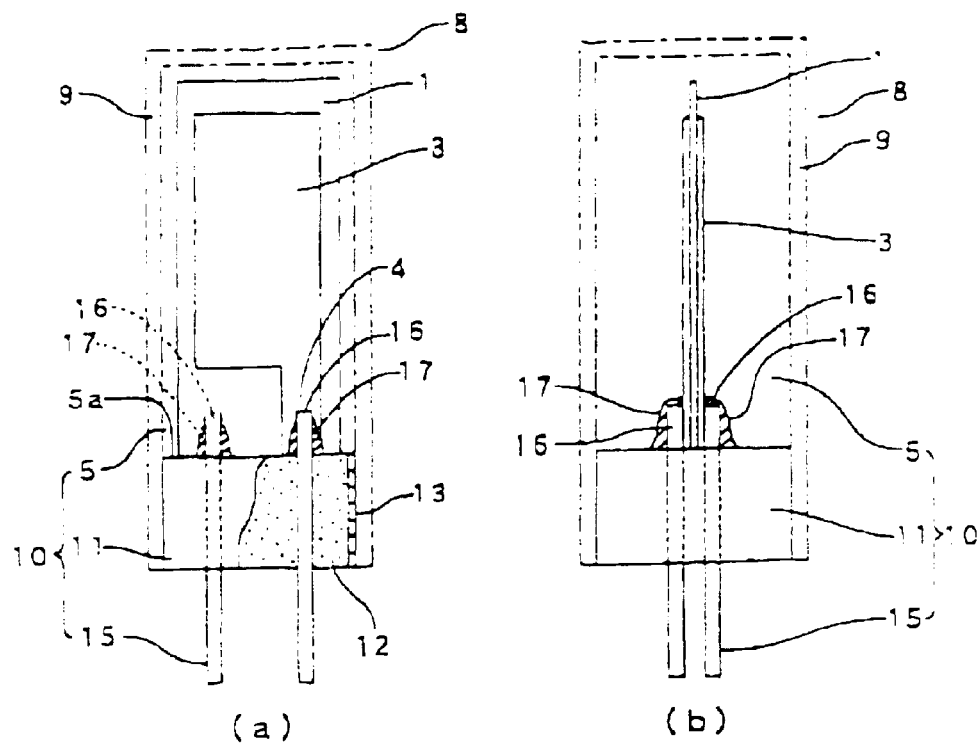
[FIG. 11]
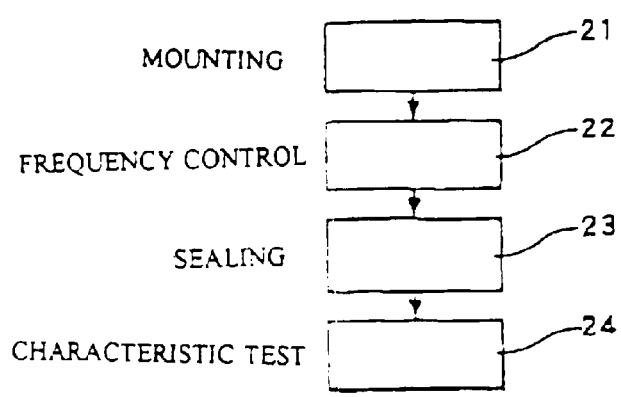
[FIG. 12]

[FIG. 13]
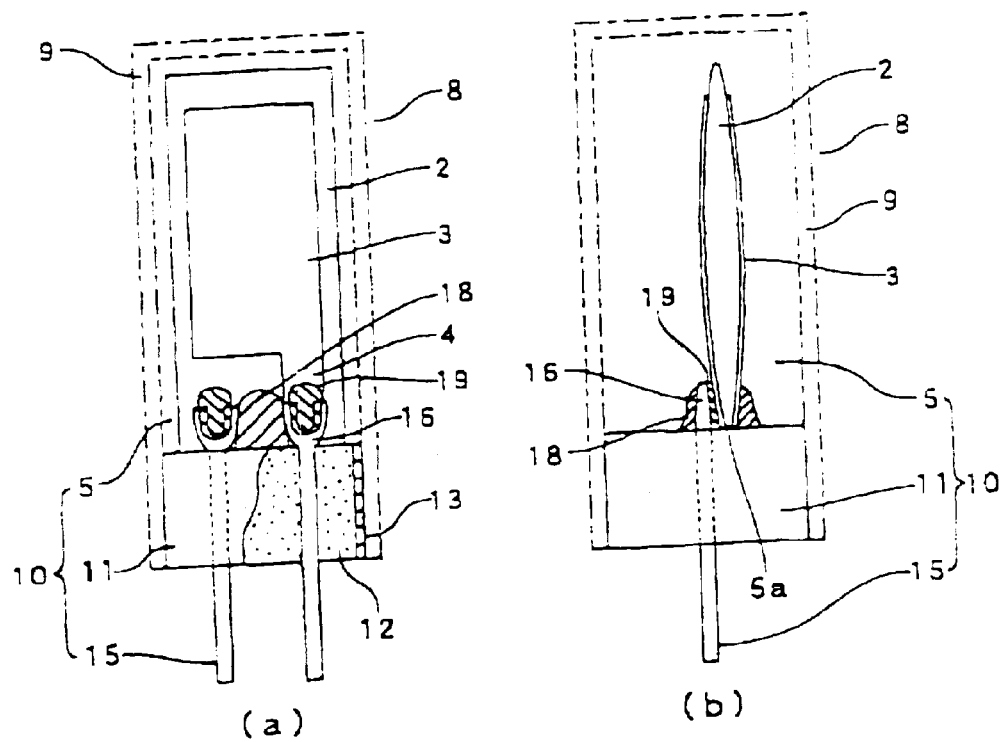

PIEZOELECTRIC VIBRATOR AND MANUFACTURE THEREOF, AND PIEZOELECTRIC VIBRATOR UNIT

BACKGROUND OF THE INVENTION

1. Field of Invention

The present invention relates to a piezoelectric resonator such as a quartz crystal resonator, and more particularly, to a supporting structure of a piezoelectric resonator and a method for manufacturing the same.

2. Description of Related Art

A piezoelectric resonator unit such as a quartz crystal resonator unit comprising a piezoelectric body such as a quartz crystal element having an electrode formed on the surface thereof is popularly used in an oscillating circuit for generating a prescribed frequency. Recently, there is an increasing demand for a piezoelectric resonator unit giving stable characteristics at a high accuracy as an oscillation source of a reference signal for communication equipment. FIG. 11 illustrates a front view (FIG. 11(a)) and a side view (FIG. 11(b)) of a schematic configuration of a typical conventional piezoelectric resonator unit. A piezoelectric resonator 10 of the piezoelectric resonator unit 8 is provided with a resonator element 5 comprising a thin and flat quartz crystal piece 1 as a piezoelectric body, having an electrode 3 formed on each of the two surfaces thereof by vapor deposition or the like, and a cylindrical plug 11 supporting the resonator element 5. The plug 11 has a metal frame 13 surrounding an insulating member 12 made of a material such as covar glass having an electrolytically plated outer periphery, and two round bar-shaped leads 15 running through this insulating member 12. Leading ends 16 of these two leads 15 are respectively solder-connected to connecting electrodes 4 of the resonator element 5 so as to be conductive with the exterior of the plug 11 serving as a supporting member via the leads 15. The leads 15 serve also to mount the resonator element 5 onto the plug 11. Further, the piezoelectric resonator 10 shown in FIG. 11 mounts the resonator element 5 by holding it between the leads 15 to form a supporting structure with a very high rigidity.

Main steps for assembling a piezoelectric resonator unit by the use of such a piezoelectric resonator 10 are illustrated in FIG. 12. After the completion of Step 21 of mounting the resonator 5 onto the plug 11 serving as the supporting member as described above, a final resonance frequency adjustment is carried out in Step 22 by adjusting the film thickness of the electrode 3 of the resonator element 5 through vapor deposition or sputtering. Then, in Step 23, the piezoelectric resonator 10 is inserted and sealed into a case 9 in vacuum or in an inert gas atmosphere to assemble the piezoelectric resonator unit 8. Then, after conducting tests of frequency, CI-value and temperature characteristics in Step 24, the product is shipped.

As described above, in addition to the demand for a piezoelectric resonator or a piezoelectric oscillator comprising a combination of a piezoelectric resonator unit and a semiconductor as a clock source of a CPU and the like, a demand as also recently increasing for a reference signal source of communication equipment, and it is becoming increasingly necessary to have a high accuracy and stable characteristics more than the conventional reference signal source of communication equipment. Particularly, room-temperature aging property is required to be improved from about ±3 to 5 ppm/year to about ±1 ppm/year, and further, there is a demand for a piezoelectric resonator unit or a piezoelectric oscillator, in consideration of the application in a portable equipment, excellent in impact resistance and high in durability.

In the conventional piezoelectric resonator unit shown in FIG. 11, in which the leads are connected to the electrode by the use of solder 17, the connecting step exhibits a satisfactory operability, and a high connecting strength is available. When left at a high temperature of 80 to 125° C., however, solder may diffuse into the electrode, this resulting in easier deterioration of aging property and in easier occurrence of fluctuation of frequency. In addition, mounting by the use of soldering requires a preheating step at about 150 to 250° C., although for a short period of time, and a heating step at about 350° C. As a result, in a certain state of heating, there may be a distortion of temperature characteristics. When the resonator element is AT-cut, deviation occurs from an ideal cubic curve, and this makes it difficult to obtain a highly accurate frequency even by performing temperature correction. Such a phenomenon is believed to be attributable to the fact that local heating of the piezoelectric body upon connection causes a difference in temperature, crystals having different properties such as β-quartz crystal having no piezoelectric phenomenon are produced in the piezoelectric body, though to a minimum extent.

Furthermore, the conventional piezoelectric resonator unit shown in FIG. 11, in which the resonator element is connected to the plug in a state with a very high rigidity, is highly resistant to micro-vibration. The unit however has a poor resistant to a strong impact such as dropping, thus resulting in breakage or peeling of the resonator element, and hence making the unit unserviceable at a high probability.

To overcome these defects, Japanese Unexamined Patent Publication No. 6-303,077 discloses a technique of connecting the leads and the resonator element by means of a conductive adhesive in place of solder, and connecting the leads only to a side surface of the resonator element. Although there is not an explicit description in the Japanese Unexamined Patent Publication No. 6-303,077, with the use of such a conductive adhesive, solder diffusion can be avoided even when left exposed to a high temperature as described above, thus permitting improvement of aging property, and absence of heating to a high temperature upon mounting leads to a slight distortion of temperature characteristics, thus making it possible to provide a product of a very high accuracy. In this technique, flattened leads are attached to one side surface of the resonator element, in place of mounting the resonator element by holding it between high-rigidity bar-shaped leads. It is therefore known that a high impact resistance is available, and the probability of becoming unserviceable as a result of dropping (dropping property) becomes lower. Even in a resonator element adopting such a supporting method, a piezoelectric resonator unit 8 using a piezoelectric body 2 of a convex shape as shown in FIG. 13 results in a relatively large weight of the resonator element 5, and stress tends to be concentrated at the constriction at the leading end of the mounting section, thus causing an occurrence of peeling. It is therefore impossible to achieve a remarkable improvement in the dropping property.

Further, in a piezoelectric resonator 10 shown in FIG. 13, the leading end 16 of the bar-shaped lead 15 is flattened into substantially a U shape, and the leading end 16 and a connecting electrode 4 are connected with a conductive adhesive 19. A plug-side edge 5a of the resonator element 5 is mounted onto the plug 11 whit a non-conductive adhesive 18. There is therefore available an improved operability as compared with the conventional piezoelectric resonator 10 shown in FIG. 11, in which mounting is accomplished so that both sides of the resonator element are in contact with the bar-shaped leads. However, in view of the time and labor required for injecting the conductive adhesive into an appropriate gap formed between the leading end 16 and the connecting electrode 4, and for holding the resonator element 5 and the plug 11 at prescribed positions with the use of devices and jigs until setting of the injected conductive adhesive, operability of the step of causing the coated adhesive to set is not high as compared with the step for carrying cut soldering, and the devices and jigs for positioning the resonator element and the plug have a low operating efficiency.

SUMMARY OF THE INVENTION

An object of the present invention is therefore to provide a piezoelectric resonator and a piezoelectric resonator unit, in which a resonator element is mounted on a supporting member by means of a resin adhesive, excellent in aging property and high in accuracy, wherein impact resistance is further improved. Another object of the invention is to provide a piezoelectric resonator and a method for manufacturing the same, which permits the efficient manufacture of a piezoelectric resonator and a piezoelectric resonator unit in which mounting is accomplished by the use of such a resin. A further object of the invention is to provide at a low cost a piezoelectric resonator and a piezoelectric resonator unit for a communication equipment of a high demand by providing a piezoelectric resonator and a piezoelectric resonator unit high in productivity and accuracy.

To achieve the foregoing objects of the invention, in contrast to the conventional piezoelectric resonator in which a piezoelectric resonator element is fixed directly to a supporting member with an adhesive, or fixed by soldering using a metal requiring heating for melting, resulting in a rigid structure, the present invention permits improvement of impact resistance by achieving a soft structure through connection of the piezoelectric resonator element to the supporting member only through leads by the use of a conductive resin. More specifically, in the piezoelectric resonator of the invention comprising a piezoelectric resonator element comprising a piezoelectric body having an electrode formed on the surface thereof, a supporting member supporting the piezoelectric resonator element, and a plurality of leads mechanically connecting the piezoelectric resonator element to the supporting member and permitting electrical connection thereof, each of the leads is provided with a flat leading end portion correctable substantially in parallel with the electrode, and opening substantially in a U shape toward the leading end. A connecting layer is formed with a conductive resin in the gap between the leading end portions and the electrode, and further, the piezoelectric resonator element is supported by the leads so as to form a gap between the supporting member and the piezoelectric resonator element.

In the piezoelectric resonator of the invention, for example, the piezoelectric element is attached to the leads, so that the edge of the piezoelectric resonator element on the side facing the supporting member is substantially positioned at the end on the side of the opening of the leading end portion substantially in a U shape facing the supporting member. As a result, the piezoelectric resonator element is supported by the leads having ends shaped into a sheet by means of an elastic resin in a state in which the piezoelectric resonator element is floating from the supporting member, thus achieving a soft (spring) structure supporting mechanism. Consequently, the supporting mechanism of the soft structure by the use of highly elastic leads can absorb a strong impact such as that occurring in being dropped. Occurrence of an inconvenience such as peeling even upon application of a strong impact can therefore be prevented, and it is possible to provide a piezoelectric resonator unit high in impact resistance. As a result, even in a piezoelectric resonator unit using a resonator element poor in impact resistance resulting from a relatively large weight and tending to cause stress concentration at the connecting portion, for example, in a convex one, it is possible to improve the dropping property and increase durability.

Further, by mounting the piezoelectric resonator element so that the edge thereof substantially matches the end of the U-shaped opening of the leading end, the attaching position can be easily confirmed, thus minimizing variation of the position. It is therefore possible to avoid variation of impact resistance and flowing of the conductive resin through the opening bottom at the leading end portion opening in a U shape, which may cause a short circuit.

By shaping the leading end of the round bar-shaped lead into a sheet (flat) shape, the leading end portion cross-section is tapered, converging toward the leading end. As a result, it is possible to ensure a sufficient thickness of a conductive resin (conductive adhesive) such as a silver paste in a sufficient quantity between the resonator element and the leads only by coating the conductive resin onto the U-shaped leading end portions of the leads. This permits connection of the resonator element and the leads with a sufficiently high strength by the use of the conductive resin, and additionally, the resistance at the contact portion can remain at a low level. Further, because the leads and the resonator element can be connected with the conductive resin, the piezoelectric resonator element is never exposed to high temperatures as compared with the conventional piezoelectric resonator using soldering. It is therefore possible to provide a piezoelectric resonator unit satisfactory in aging property, high in accuracy and excellent in temperature characteristics. According to the present invention, as described above, it is possible to provide a piezoelectric resonator with a further improved impact resistance (dropping property), high in durability and accuracy, and having stable properties, and by sealing this piezoelectric resonator in a protector such as a case, it is possible to provide a piezoelectric resonator unit of an excellent quality.

Prior to forming a connecting layer, a temporary fixing layer can be formed by coating a UV-setting resin having a very short setting time so as to temporarily fix the leading end portions and the piezoelectric resonator element resonator element). Provision of this temporary fixing layer permits positioning of the supporting member and the piezoelectric resonator element prior to coating the conductive resin. Thereafter, therefore, the conductive resin an be injected into the gap between the leading end portions and the electrode without the need to hold the supporting member and the piezoelectric resonator element at a prescribed position by means of devices and jigs to wait for the subsequent setting, thus permitting considerable improvement of operability upon mounting the resonator element onto the leads. It is also possible to improve reliability of the connecting portion between the leads and the electrode since there is no possibility of an occurrence of a positional shift during operation. Further, by providing the temporary fixing layer on the side facing the adjacent lead, it is possible to impart the function of preventing short circuit between leads upon coating the conductive resin.

The conductive resin may be previously coated onto at least any one of the leading end portions and the electrode and then they may be stuck together. By previously coating the conductive resin, the gap between the leading end portions and the electrode can be filled with the conductive resin in a sufficient quantity, so that a good contact and a high adhesion are available. It is therefore possible to conduct temporary fixing by only holding for a short period of time without the need to use a temporary fixing layer, and by leaving as it is without the use of jigs, a sufficient adhesion is available. As a result, it is possible to omit the UV-setting type resin for temporary fixing. As compared with soldering, the UV-setting resin is excellent in high-temperature stability. However, because a slight amount of out-gas is observed at high temperatures, omission of the UV-setting type resin permits further improvement of high-temperature properties.

By forming a reinforcing layer by coating the conductive resin or the non-conductive resin so as to cover at least the connecting layer and the leading end portions, it is possible to improve the connecting strength between the leads and the piezoelectric resonator element, and reliability of the connecting portion through prevention of the occurrence of peeling. Further, because notch portions formed by the leads and the piezoelectric resonator element are eliminated, stress concentration does not occur, and impact resistance including dropping property can be improved.

In the method for manufacturing the piezoelectric resonator of the invention, when attaching the piezoelectric resonator element comprising a piezoelectric body having an electrode formed on the surface thereof to the plurality of leads which mechanically connect to the supporting member and permit electrical connection thereof, i.e., when mounting the piezoelectric resonator element onto the supporting member such as a plug, there is provided a connecting step of forming a connecting layer of a conductive resin in the gap between the flat leading end portions connectable substantially in parallel with the electrode, opening substantially in a U shape toward the leading end and the electrode of the piezoelectric resonator element. In this connecting step, it is possible to use a process comprising a first step for forming a temporary fixing layer by coating a UV-setting type resin onto at least a part of the leading end portions of the leads and the piezoelectric resonator element, and a second step for forming a connecting layer by injecting a conductive resin at least into a gap between the leading end portions and the electrode.

By adopting the manufacturing method provided with such a temporary fixing step, it is possible to efficiently perform the mounting operation even by using a conductive resin requiring a longer period of time for setting than in soldering, without the need for occupying positioning devices and jigs for a long time, and to provide a highly reliable piezoelectric resonator at a low cost. By coating the UV-setting type resin onto the side facing the adjacent lead in the first step, it is possible to prevent the conductive resin from flowing onto the side of the adjacent lead, thus permitting further improvement of operability upon forming the connecting layer.

Prior to connecting the leading end portion to the electrode in the connecting step, a conductive resin may be coated onto the leading end portion or the electrode to form the connecting layer by stacking them together. In this method which permits omission of the UV-setting type resin, the connecting step can further be simplified. Since the connecting layer can be formed with the conductive resin in a sufficient quantity in the gap between the leading end portion and the electrode, a sufficient adhesion can be ensured, and resistance to the connecting portion can be reduced.

Further, by adopting a reinforcing step of forming a reinforcing layer by coating a conductive resin or a non-conductive resin so as to cover at least the connecting layer and the leading end portions of the leads, it is possible to improve strength and reliability of the connecting portion in mounting. The conductive resin injected in the foregoing second step should preferably have fluidity to some extent for ensuring a close contact between the leads and the electrode. In the reinforcing step, in contrast, a conductive resin or a non-conductive resin having a viscosity higher than that of the conductive resin coated in the second step should preferably be used for ensuring a sufficient strength and preventing diffusion. When adopting the method of previously coating the conductive resin onto the electrode or the leading end portions of the leads and then sticking them together, protection can be provided by applying a secondary coating of a conductive resin of the same type.

BRIEF DESCRIPTION OF THE DRAWINGS

FIG. 1 illustrates a schematic configuration of a piezoelectric resonator and a piezoelectric resonator unit of an embodiment of the present invention: FIG. 1(a) is a front view and FIG. 1(b) is a side view;

FIG. 2 is a side view illustrating a schematic configuration of a piezoelectric resonator and a piezoelectric resonator unit adopting a flat resonator element in place of the convex resonator element shown in FIG. 1;

FIG. 3 illustrates a step of mounting the resonator element shown in FIG. 2, which represents a state in which leads for mounting and a resonator element are prepared;

FIG. 4 illustrates a step of mounting subsequent to FIG. 3, which represents a state in which a temporary fixing layer is formed on the leads and the resonator element;

FIG. 5 illustrates a step of mounting subsequent to FIG. 4, which represents a state in which a connecting layer is formed or the leads and the resonator element;

FIG. 6 illustrates a step of mounting subsequent to FIG. 5, which represents a state in which a reinforcing layer is formed on the leads and the resonator element;

FIG. 7 is an enlarged view of the connecting portion of the connecting electrode of the resonator element having a connecting layer formed thereon and the leads in FIG. 6;

FIG. 8 shows graphs comparing the result of a dropping test of the piezoelectric resonator unit shown in FIG. 1 and the test result of a conventional piezoelectric resonator unit: FIG. 8(a) represents the test result of the piezoelectric resonator unit shown in FIG. 1; FIG. 8(b), the test result of a piezoelectric resonator unit in which a resonator element is mounted using conventional round bar-shaped leads shown in FIG. 11; and FIG. 8(c), the test result of a piezoelectric resonator unit in which a resonator element is mounted by the use of a conventional adhesive shown in FIG. 13;

FIG. 9 illustrates views of a manufacturing method different from the above: FIG. 9(a) represents a state in which a silver paste is primary-coated on a side of the resonator element; and FIG. 9(b), a state in which the silver paste is primary-coated on the leading end portion of the lead;

FIG. 10(a) illustrates a state in which leads are attached to the resonator element; and FIG. 10(b), a state in which the silver paste is further secondary-coated;

FIG. 11 illustrates a schematic configuration of a piezoelectric resonator and a piezoelectric resonator unit, in which a resonator element is mounted by using conventional round bar-shaped leads: FIG. 11(a) is a front view; and FIG. 11(b), a side view;

FIG. 12 is a flowchart illustrating a schematic process for manufacturing a piezoelectric resonator unit through assembly of a piezoelectric resonator; and FIG. 13 illustrates a schematic configuration of a piezoelectric resonator and piezoelectric resonator unit, in which a piezoelectric resonator element is mounted by using a conventional adhesive: FIG. 13(a) is a front view; and FIG. 13(b) is a side view.

DETAILED DESCRIPTION OF PREFERRED EMBODIMENTS

Now, embodiments of the present invention will be described below with reference to the drawings. FIG. 1 illustrates a front view (FIG. 1(a)) and a side view (FIG.

1(b)) of a schematic configuration of a piezoelectric resonator of the invention and a piezoelectric resonator unit using the same. The piezoelectric resonator 10 of this embodiment has a resonator element 5 comprising a piezoelectric body such as a then lens or a convex quartz crystal piece 2 having electrodes 3 formed on both surfaces thereof by vapor deposition or the like, and a cylindrical plug 11 serving as a supporting member for this resonator element 5. Plug 11 is provided, as in the foregoing convention al piezoelectric resonator, with an insulator 12 such as covar glass, and a ring 13 serving as the metal frame having an electrolytically plated outer periphery. In the piezoelectric resonator 10 of this embodiment, two round bar-shaped metallic leads 15 run through the insulator 12 of the plug 11, and the leading end potions 16 connected to the connecting electrode 4 of the resonator element 5 are flattened. The leading end portion 16 is worked into a U-shaped opening toward the leading end, and a connecting layer 32 is formed by injecting a silver paste serving as a conductive resin into the U-shaped opening 31. Further, a reinforcing layer 33 is formed over this connecting layer 32 by coating a thermosetting resin or the like, and this reinforcing layer 33 covers the entire leading end portions up to the outside thereof. A temporary fixing layer 34 is formed on the leading end portion 16 of one of the leads by coating a UV-setting type resin in the direction of the other lead adjacent thereto. This temporary fixing layer 34 has a function of fixing the resonator element 5 and the plug 11 so that they do not deviate from the respective positions.

In the piezoelectric resonator 10 of this embodiment, the resonator element 5 is positioned relative to the plug 11 so that the edge 5a of the resonator element 5 on the side facing the plug 11 substantially matches the end 31a of the U-shaped openings 31 of the leading end portions 16 on the side facing the supporting member 12, and consequently, a gap 35 is formed between the resonator element 5 and the plug 11. After mounting of the resonator element 5 onto the plug 11, toe final frequency adjustment is carried out as described above: the piezoelectric resonator 10 after frequency adjustment is sealed in a case 9 serving as a protector, thus forming a piezoelectric resonator unit 8.

In a quartz crystal resonator unit using quartz crystal as a piezoelectric body, it is possible to achieve a piezoelectric resonator unit of any frequency within a wide frequency range by selecting appropriate cutting direction and shape. In the case where the resonator is AT-cut and the vibrational mode is a fundamental mode, in general, a convex piezoelectric body as shown in FIG. 1 is used for a resonance frequency of about 16 MHz, and for a piezoelectric resonator of a resonance frequency of over this level, a flattened piezoelectric body as shown in FIG. 2 is employed. In the flattened piezoelectric resonator 10 as shown in FIG. 2 as well, the resonator 5 can be mounted onto the plug 11 in the same manner as above. In the following description of the manufacturing method, the case with a flat piezoelectric body 1 will be explained for simplification. In the piezoelectric resonator 10 using a convex piezoelectric body 2 for a low frequency range, on the other hand, the piezoelectric body 2 has a relatively large weight, and in addition, a thick center portion of the piezoelectric body and a thin edge portion connected to the leads 15 result in easy stress concentration and a shape tending to be broken under an impact. For the therefore, a piezoelectric resonator 10 using a convex piezoelectric body is described as an example.

FIGS. 3 to 6 schematically illustrate steps of mounting the resonator element 5 onto the plug 11 serving as a supporting member for the manufacture of the piezoelectric resonator 10 of the present embodiment. Each of FIGS. 3 to 6 show a front view (a) and side view (b) of the mounting portion of the piezoelectric resonator 10 with respect to the leading end portion 16 of the lead 15 and the edge 5a of the resonator element 5 on the side facing the plug 11. As shown in FIG. 3, two leads 15 are attached so as to run through an insulator 12 of the plug 11 of this embodiment, and the leading end portion 16 thereof is shaped so that the shape changes from a bar gradually into a sheet. As shown in FIG. 3(b), therefore, the leading end portion 16 of the lead has a cross-sectional shape changing into a tapered shape from the side facing the plug 11 toward the leading end of the resonator element 5. Further, a U-shaped opening 31 which opens toward the leading end is formed in the leading end portion 16. This leading end portion 16 shaped substantially into a sheet or a flattened shape is positioned so as to be substantially in parallel with the connecting electrode 4 prepared on a side surface of the resonator element 5, which are connected in a subsequent step.

The connecting step oh this embodiment for mounting the resonator element onto the plug 11 via the leads 15, first in a first step as shown in FIG. 4, setting is performed so that the edge 5a of the resonator element 5 on the side facing the plug 11 substantially matches the end 31a of the U-shaped opening 31 of the lead on the side facing the plug. Because the matching of the edge 5a of the resonator element 5 with he end 31a of the U-shaped opening 31 of the lead can be used as reference in manual operation as well as in mechanical operation, positioning can be accurate and easy. Upon completion of positioning, a UV-setting type resin is coated into the gap between the leading end portion 16 of one of the leads and the connecting electrode 4 of the resonator element 5. Then, the UV-setting type resin is hardened by irradiating ultraviolet rays (UV) having an irradiation intensity within a range of from 700 to 1,000 mW/cm$^2$ for only about five seconds, thereby forming a temporary fixing layer for temporarily fixing the resonator element 5 onto the leading end portion 16 of the lead. This temporary fixing layer 34 should preferably be formed on the side facing the leading end portion of the other lead, i.e., between the leading end portions 16 of the two leads so as to prevent the two leading end portions 16 or the electrodes 4 from being short-circuited by the conductive resin coated in the next step.

The temporary fixing layer 34 formed in the first step suffices to have a quantity sufficient to fix the leading end portion 16 of the lead and the electrode 4 with a strength capable of preventing a relative positional shift between the resonator element 5 and the lead 15 in the subsequent mounting operation. Therefore, only a small quantity of UV-setting type resin will do, and temperature increase of the resonator element 5 when setting can be inhibited to about 60° C. Further, irradiation of ultraviolet rays for about five seconds is sufficient to fully set the coated UV-setting type resin. As a result the temporary fixing layer 34 can be formed in a very short period of time, and there is no risk of the crystal status of the piezoelectric body 1 affected by the formation of the temporary fixing layer 34. It is therefore possible to position the resonator element 5 and the plug 11 with no influence on temperature characteristics of the piezoelectric resonator. In addition, since forming of the temporary fixing layer 34 sets positions of the resonator element 5 and the plug 11, it is not necessary to carry out the subsequent operations white maintaining the positional relationship between he resonator element 5 and the plug by mechanically holding both the resonator element 5 and the plug 11, thus resulting in a very efficient mounting operation. The time for occupying devices and jigs for mechanically holding the resonator element 5 and the plug 11 at prescribed positions is reduced to the time from coating to setting of the UV-setting type resin, it is possible to improve operating efficiency of these devices and jigs, thus largely contributing to the productivity improvement. Further, once positioning is completed, a positional shift never occurs in the next step, thus ensuring a high reliability of the connecting portion.

After forming the temporary fixing layer 34, a connecting layer 32 is formed in the second step by injecting a silver paste as a conductive resin into the U-shaped opening 31 of the leading end portion 16 as shown in FIG. 5. Because the leading end portion 16 of the lead forms a U-shaped opening 31, the silver paste can be injected into this opening 31. Therefore, arranging of the injecting position and control of the quantity of coating are very easy. Further, when injecting the paste into the opening 31, a flow-out port of the silver paste is not formed since the edge 5a of the resonator element 5 matches the end 31a of the opening 31, and the silver paste flows along the leading end portion of the lead, thus preventing the silver paste from flowing to other places than the connecting electrode 4. It is therefore possible to prevent occurrence of such circumstances as short circuit of both electrodes of the piezoelectric body 1 or impossibility to achieve a prescribed connecting strength because of an insufficient quantity of silver paste. In the piezoelectric resonator 10 of this embodiment, the temporary fixing layer 34 is formed between the electrodes 4 in the first step, and this temporary fixing layer 34 separates the electrodes 4 or the leading end portions 16. A slight outflow of silver paste does not cause short circuit.

As shown in an enlarged view of FIG. 7, furthermore, the leading end portion 16 of the lead in this embodiment is tapered, converging toward the leading end. An appropriate gap is therefore formed between the leading end portion 16 and the electrode 4. Silver paste comes into this gap 36 by capillarity and thus connects the leading end portion 16 and the electrode 4. This achieves a satisfactory connecting state electrically as well as mechanically between the lead 15 and the electrode 4 with a very low contact resistance, ensuring a sufficient connection strength, thus permitting prevention of the occurrence of peeling or the like. In order to ensure that the silver paste comes in the gap 36 and is prevented from flowing into other areas, a paste having a viscosity within a range of from 35,000 to 60,000 CPS should preferably be selected. A viscosity within a range of from 40,000 to 50,000 CPS is the most suitable. With a viscosity of under 30,000 CPS, the resin tends to flow out from the prescribed region upon coating, and bleeding in which silver particles are diffused during hardening of the silver paste may occur, or the paste may form a source of generation of an out-gas because of a high content of solvent. It is also possible to a conductive adhesive other than silver paste, but taking account of conductivity, heat resistance and operability, the silver paste is considered the best.

After the completion of the second step of ensuring conductivity, a reinforcing step of forming a reinforcing layer 33 is carried out by coating a reinforcing adhesive on the connecting layer 32 so as to cover the leading end portion 16 of the lead. The reinforcing adhesive may be a thermosetting resin such as epoxy or polyimide resin or a non-conductive resin such as a UV-setting type resin, or a conductive resin such as a silver paste. Unlike the silver paste used in the second step, the resin forming the reinforcing layer 33 should preferably have a low fluidity within a range capable of covering a prescribed area. It is therefore desirable to select a conductive or non-conductive resin having a viscosity within a range of from 70,000 to 90,000 CPS. After formation of the reinforcing layer 33, a heating treatment is applied in the open air or in a nitrogen atmosphere, at a temperature of from 160 to 180° C. for about an hour for full setting of the reinforcing layer 33 and the connecting layer 32. Exposure to this temperature atmosphere for several hours exerts no adverse effect on the characteristics of the piezoelectric body. Because this is not a local heating as in soldering, there is no influence in the piezoelectric body. Therefore, the piezoelectric resonator element 5 mounted through these steps involves almost no risk of occurrence of distortion in temperature characteristics, thus permitting provision of a piezoelectric resonator unit having a very high accuracy. In a soldered piezoelectric resonator, frequency may change under the effect of diffusion of solder. The piezoelectric resonator of the present embodiment is in contrast free from such change in frequency even when the piezoelectric resonator unit is left at high temperatures, thus the present embodiment permits provision of a piezoelectric resonator unit excellent in aging property, and capable of performing stable characteristics with a high accuracy. Because it is possible to improve operability by adopting a temporary fixing layer, the mounting operation using an adhesive can be effected at a high efficiency. It is therefore possible to mass-produce the high-quality piezoelectric resonator unit of this embodiment at a low cost.

The reinforcing layer 33 formed in this reinforcing step should preferably completely cover the leading end portions 16 of the leads. Unless the reinforcing layer 33 is formed beyond the leading end portions 16 of the leads, stress tends to concentrate at an edge of contact between the leading end portions 16 and the electrode 4 or at a corner under the effect of an impact force resulting from dropping or the like. The leading end portions 16 therefore tend to easily peel off from the electrode 4. In contrast, when the leading end portion 16 and the surrounding periphery are covered with the reinforcing layer 33, stress upon impact is dispersed through the reinforcing layer 33, and the stress can be absorbed by the entire leading end portion 16 of the flattened lead, thus permitting prevention of peeling caused by an impact. Particularly, the piezoelectric resonator 10 of the present embodiment, in which the gap 35 is formed between the resonator element 5 and the plug 11, makes it possible to the leading end portion 16 to flex under an impact. Further, the leading end portion 16 is connected to the resonator element 5 via elastic resin layers including the connecting layer 32 and the reinforcing layer 33. By adopting this soft structure, peeling does not occur easily in the leading end portion 16 and the electrode 4 connected by the connecting layer. It is thus possible to provide a piezoelectric resonator 10 using a flat piezoelectric body 1 as shown in FIG. 2, and further, a piezoelectric resonator 10 having a high impact resistance even by using a convex resonator element 5 as shown in FIG. 1 which is relatively heavy in weight and tends to easily peel off.

FIG. 8 illustrates the result of a dropping test of a piezoelectric resonator unit 8 sealing the piezoelectric resonator element 10 of this embodiment, in comparison with the results of dropping tests of the conventional piezoelectric resonator unit shown in FIG. 11 or 13. The test, the result of which is shown in FIG. 8, comprises dropping a piezoelectric resonator unit having a resonance frequency of 12.8 MHz from a height of 125 cm, and determining the number of piezoelectric resonator units normally functioning relative to the number of repetitions of dropping runs as the survival rate (%). The piezoelectric resonator unit of the resonance frequency of 12.8 MHz uses a piezoelectric body shaped into a low frequency convex shape as described above and is considered to be under severe conditions. In spite of such severe conditions of the dropping test, the piezoelectric resonator unit of this embodiment having a soft structure in which the resonator element 5 is attached in floatation from the plug 11 with the resin layers, as shown in FIG. 8(a), showed a survival rate of almost 100% after 100 repetitions of the dropping test, suggesting that there occurs almost no trouble such as peeling. In the conventional piezoelectric resonator unit in which a convex resonator element is supported by round bar-shaped leads as shown in FIG. 11, 100 repetitions result in a survival rate of about 50% as shown in FIG. 8(b), suggesting occurrence of troubles such as breakage in about a half the piezoelectric resonator units. In the piezoelectric resonator unit in which the resonator element is supported by leads having leading ends flattened as shown in FIG. 13, the survival rate of about 70% after 100 repetitions shown in FIG. 8(c) is improved over the test result of FIG. 8(b). Under conditions including adoption of the convex resonator element, however, peeling occurs in 20 to 30% of the tested piezoelectric resonator units. By adopting the piezoelectric resonator of this embodiment, in contrast, it is possible to inhibit occurrence of inconveniences such as peeling to almost 0% even under similar conditions, thus suggesting the possibility to manufacture a piezoelectric resonator and a piezoelectric resonator unit very excellent in durability in the present invention. In the piezoelectric resonator and the piezoelectric resonator unit using a flat resonator element, conditions relative to impact are more generous than in the adoption of the convex resonator element, so that it is possible to provide a piezoelectric resonator and a piezoelectric resonator unit further excellent in durability.

FIGS. 9 and 10 schematically illustrate a manufacturing method, different from the above, comprising mounting a resonator element 5 onto a plug 11 serving as the supporting member for the manufacture of the piezoelectric resonator 10 of the invention. In this manufacturing method also, a piezoelectric resonator 10 is assembled by the use of a plug 11, leads 15 and a resonator element 5 in the same configuration as above. In this embodiment, a silver paste 51 serving as a conductive resin is first coated onto any or both of a connecting electrode 4 prepared on one side surface of the resonator element 5 and leading end portions 16 of the leads 15, as shown in FIGS. 9(a) and 9(b). Then, as shown in FIG. 10(a), the leading end portions 16 of the leads and the connecting electrode 4 are stuck together on the surfaces thereof coated with the silver paste with a gap 35 from the plug 11, and the resonator element 5 is attached to the plug 11 via the leads 15. As a result, the silver paste 51 expands in the gap between the leading end portions 16 of the leads and the connecting electrode 4, and this silver paste 51 forms a connecting layer 32. In this state, the resultant assembly is temporarily dried by holding it in an atmosphere at about 300° C. for five second. This reduces the solvent concentration in the silver paste 51, and thus the resonator element 5 is temporarily fixed to the plug 11. After the temporary drying, therefore, no positional shift occurs between the connecting electrode 4 and the leading end portions 16 of the leads unless an impact is applied, allowing easy handling.

When the connecting layer 32 is formed between the leading end portions 16 of the leads and the connecting electrode 4 and the resonator element 5 is temporarily fixed to the plug 11, the silver paste 52 is coated on outside the leading end portions 16 of the leads 15 as shown in FIG. 10(b) so as to cover the leads 15 outside and the leading end portions 16 hereof, thereby forming a reinforcing layer 33. Then, in the case of a thermosetting silver paste, full drying is carried out at a temperature of from 160 to 180° C. for period of from 30 minutes to an hour. In the case of a thermoplastic silver paste, full drying can be accomplished by holding it in an atmosphere of 300 to 350° C. for a period of from one to two hours.

In the manufacturing method of the present embodiment, as described above, the connecting layer 32 can be formed by stacking together the leading end portions 16 and the connecting electrode 4 after primary-coating the silver paste 51 onto any of these members. Further, the reinforcing layer 33 can be formed by secondary-coating the silver paste 51 after connection. Since it is not necessary to inject the silver paste into the narrow gap for forming the connecting layer 32 in the manufacturing method of this embodiment, it is possible to use the same silver paste as the silver pastes 51 and 52 for primary and secondary coating. For example, a thermoplastic conductive adhesive Product No. 101 made by STAYSTICK Co. may be used.

When such a manufacturing method is adopted, the connecting layer 32 can be formed with the silver paste 51 in a sufficient quantity between the leading end portions 16 and the connecting electrode 14. It is therefore possible to ensure a high connecting strength, and to further reduce contact resistance. Because it is not necessary to tack the assembly by the use of a UV-setting type resin, the operating process of attaching the resonator element 5 to the plug 11 is further simplified. A UV-setting type resin, higher in high-temperature stability than solder, releases gases in slight amounts when it is exposed to high temperatures for a long period of time. Upon occurrence of out-gases, there is a change in atmosphere an the interior of the case 9, and this adversely affects the environment of the resonator element 5 and causes deterioration of aging property. In this embodiment, in contrast, the connecting layer 32 and the reinforcing 33 can be formed with only the silver paste containing solvent in a slight amount, thus making it possible to provide a piezoelectric resonator 10 further excellent in high-temperature properties.

A piezoelectric resonator unit 8 was manufactured by sealing a piezoelectric resonator 10 formed from a connecting layer 32 and a reinforcing layer 33 with a sliver paste in a case 9, and a dropping test was carried out under the same conditions as above. As in the case of the piezoelectric resonator unit of the present invention described above, a survival rate of almost 100% was obtained after 100 repetitions of dropping run, thus permitting confirmation that there occurred almost no trouble such as peeling.

In the above description, the piezoelectric resonator having a cylindrical plug adapted to be inserted into the cylindrical holder 9 as the supporting member, has been used for explaining the invention. However, the invention is not limited to a piezoelectric resonator and a piezoelectric resonator unit of the foregoing type. For example, it is needless to mention that the invention is applicable to a piezoelectric resonator unit of a type manufactured by mounting a piezoelectric resonator element onto leads arranged on one of the walls of a box-shaped holder as a supporting member, and using the same by placing a cover onto that box-shaped holder for sealing.

In the present invention, as described above, a piezoelectric resonator is manufactured by connecting a resonator element to leading end portions of leads with a gap from a supporting member such as a plug with a conductive resin. While, in the conventional piezoelectric resonator, the resonator element is rigidly fixed to the supporting member, it is possible, in the invention, to attach the resonator element in a soft manner to the supporting member, thus allowing remarkable improvement of impact resistance against, for example, dropping. As a result, there are available a piezoelectric resonator and a piezoelectric resonator unit, comprising a resin-fixed type piezoelectric resonator excellent in accuracy and aging property, nigh in impact resistance, good in durability and having a high reliability.

Further, by temporarily fixing the leads and the resonator element with a UV-setting type resin having a very short setting time prior to connecting the leads and the resonator element and reinforcing the connection, it is possible to largely reduce the time for mechanically holding the piezoelectric resonator for positioning. Once the leads and the resonator element are temporarily fixed, it is no more necessary to simultaneously hold the resonator element and the plug by means of devices and jigs, thus permitting considerable improvement of operability.

A silver paste, which is a conductive adhesive, may be coated onto any one of the leading end portions and the connecting electrode of the resonator element, and the leading end portions and the connecting electrode may be stuck together. By adopting this manufacturing method, it is possible to omit the temporary fixing step using the UV-setting type resin, and thus to further simplify the assembly process. Furthermore, it is possible to form the reinforcing layer with a highly heat-resistant silver paste, in addition to the connecting layer, thus making it possible to assemble the resonator element and the supporting member without using the UV-setting type resin. It is therefore possible to further reduce factors causing deterioration of high-temperature properties such as occurrence of out-gas.

According to the invention, it is thus possible to mass-produce at a low cost a piezoelectric resonator unit high in accuracy and reliability and provided with excellent properties useful for reference signal in a communication equipment.

Industrial Applicability

The present invention is applicable for an oscillation source of a reference signal of a communication equipment, for example, for a piezoelectric resonator unit such as a quartz crystal resonator unit comprising a piezoelectric body such as a quartz crystal piece having an electrode formed on the surface thereof. Particularly, there is available a piezoelectric resonator unit having high-accuracy and stable properties over a wide temperature range, high in impact resistance and having a satisfactory aging property.

What is claimed is:

1. A piezoelectric resonator, comprising:
    a piezoelectric resonator element having a piezoelectric body and electrodes disposed on the piezoelectric body;
    a supporting member supporting said piezoelectric resonator element; and
    a plurality of leads mechanically connecting said piezoelectric resonator element said supporting member and permitting electrical connection thereof, each of said leads being provided with a flat leading end portion having a substantially U-shaped edge which opens toward a leading end of the leads, each flat leading end portion being connected substantially in parallel with an electrode using a connecting layer formed with a conductive resin between the flat leading end portion and said electrode;
    a fixing layer made of a UV-setting type resin disposed on said piezoelectric resonator having a short setting time, the fixing layer fixing the leading end portions of said leads and said piezoelectric resonator element prior to format in of said connecting layer; and
    said piezoelectric resonator element being attached to the substantially U-shaped edge, on a side of said piezoelectric resonator element which faces said leads so that an edge of said piezoelectric resonator element on the side which faces said leads may be positioned on the substantially U-shaped edge and that the piezoelectric resonator element is supported by said leads so that a gap is formed between said supporting member and said piezoelectric resonator element.

2. The piezoelectric resonator according to claim 1, said leading end portion having a tapered cross-section converging toward the leading end thereof.

3. The piezoelectric resonator according to claim 1, further comprising said connecting layer being formed with a conductive resin at least injected into a gap between said leading end portion and said electrode.

4. The piezoelectric resonator according to claim 3, said fixing layer being formed on a side of one lead facing an adjacent lead.

5. The piezoelectric resonator according to claim 1, said connecting layer being formed with a conductive resin coated onto said leading end portion or said electrode.

6. The piezoelectric resonator according to claim 1, said connecting layer being provided with a reinforcing layer of a conductive resin or a non-conductive resin coated so as to cover at least said connecting layer and the leading end portion of said leads.

7. A piezoelectric resonator unit having a piezoelectric resonator, and a hollow protector, the piezoelectric resonator comprising:
    a piezoelectric resonator element having a piezoelectric body and electrodes disposed on the piezoelectric body;
    a supporting member supporting said piezoelectric resonator element; and
    a plurality of leads mechanically connecting said piezoelectric resonator element to said supporting member and permitting electrical connection thereof each of said leads being provided with a flat leading end portion having a substantially U-shaped edge which opens toward a leading end thereof, each said flat leading end portion being connected substantially in parallel with an electrode using a connecting layer formed with a conductive resin between the flat leading end portion and said electrode;
    said piezoelectric resonator element being supported by said leads so that a gap is formed between said supporting member and said piezoelectric resonator element;
    a fixing layer made of a UV-setting type resin disposed on said piezoelectric resonator having a short setting time, the fixing layer fixing the leading end portion of said leads and said piezoelectric resonator element prior to formation of said connecting layer; and
    said piezoelectric resonator being disposed within and sealed by said supporting member and said protector, and said piezoelectric resonator being attached to the substantially U-shaped edge on a side of the piezoelectric resonator element which faces said leads, so that an edge of said piezoelectric resonator element on the side which faces said leads may be positioned on the substantially U-shaped edge.

8. The piezoelectric resonator unit according to claim 7, said leading end portion having a tapered cross-section converging toward the leading end thereof.

9. The piezoelectric resonator unit according to claim 7, further comprising said connecting layer being formed with a conductive resin at least injected into a gap between said leading end portion and said electrode.

10. The piezoelectric resonator unit according to claim 9, said fixing layer being formed on a side of one lead facing an adjacent lead.

11. The piezoelectric resonator unit according to claim 7, said connecting layer being formed with a conductive resin coated onto said leading end portion or said electrode.

12. The piezoelectric resonator unit according to claim 7, said connecting layer being provided with a reinforcing layer of a conductive resin or a non-conductive resin coated so as to cover at least said connecting layer and the leading end portion of said leads.

* * * * *